US012033962B2

(12) United States Patent
Hung et al.

(10) Patent No.: US 12,033,962 B2
(45) Date of Patent: Jul. 9, 2024

(54) ELECTROSTATIC DISCHARGE (ESD) ARRAY WITH CIRCUIT CONTROLLED SWITCHES

(71) Applicant: TAIWAN SEMICONDUCTOR MANUFACTURING CO., LTD., Hsin-Chu (TW)

(72) Inventors: Tao-Yi Hung, Hsin-Chu (TW); Wun-Jie Lin, Hsinchu (TW); Jam-Wem Lee, Hsinchu (TW); Kuo-Ji Chen, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 18/232,739

(22) Filed: Aug. 10, 2023

(65) Prior Publication Data

US 2023/0395534 A1      Dec. 7, 2023

Related U.S. Application Data

(62) Division of application No. 17/199,299, filed on Mar. 11, 2021, now Pat. No. 11,817,403.

(51) Int. Cl.
*H01L 23/60*      (2006.01)
*H01L 27/02*      (2006.01)
*H02H 9/04*       (2006.01)

(52) U.S. Cl.
CPC .......... *H01L 23/60* (2013.01); *H01L 27/0266* (2013.01); *H01L 27/0292* (2013.01); *H02H 9/046* (2013.01)

(58) Field of Classification Search
CPC ........................... H01L 23/60; H01L 27/0292
See application file for complete search history.

(56) References Cited

U.S. PATENT DOCUMENTS

2020/0258775 A1      8/2020   Barrenscheen

*Primary Examiner* — Amar Movva
(74) *Attorney, Agent, or Firm* — Duane Morris LLP

(57) ABSTRACT

An electrostatic discharge (ESD) protection apparatus and method for fabricating the same are disclosed herein. In some embodiments, the ESD protection apparatus comprises: an internal circuit formed in a first wafer; an array of electrostatic discharge (ESD) circuits formed in a second wafer, wherein the ESD circuits include a plurality of ESD protection devices each coupled to a corresponding switch and configured to protect the internal circuit from a transient ESD event; and a switch controller in the second wafer, wherein the switch controller is configured to control, based on a control signal from the first wafer, each of the plurality of ESD protection devices to be activated or deactivated by the corresponding switch, and wherein the first wafer is bonded to the second wafer.

20 Claims, 12 Drawing Sheets

ELECTROSTATIC DISCHARGE (ESD) ARRAY WITH CIRCUIT CONTROLLED SWITCHES

CROSS-REFERENCE TO RELATED APPLICATION

This application is a division of U.S. patent application Ser. No. 17/199,299, filed Mar. 11, 2021, which is incorporated by reference herein in its entirety.

BACKGROUND

With the advance of integrated circuit (IC) fabrication technologies, more and more circuit blocks are integrated in a single chip. As such, in applications utilizing integrated circuits formed in a single chip, the interface circuits can be exposed to a transient electrical event, or an electrical signal of a relatively short duration having rapidly changing voltage and power. Transient electrical events can include, for example, electrostatic discharge (ESD) events arising from the abrupt release of charge from an object or person to an IC chip.

Moreover, the ESD events may stress the interface circuits inside the IC due to overvoltage conditions and high levels of power dissipation over relatively small areas of the IC. For example, high power dissipation can increase IC temperature, and can also lead to other problems, such as gate oxide punch-through, junction damage, metal damage, and surface charge accumulation. Moreover, the ESD can induce latch-up (inadvertent creation of a low-impedance path), thereby disrupting the functioning of the IC and potentially causing permanent damage to the IC from self-heating in the latch-up current path. That is why the design of an efficient (area, power, speed) ESD protection network is among the one of the most critical reliability issues for IC manufacturing. In particular, the ICs are more vulnerable to an ESD stress as semiconductor fabrication technologies advance into the deep sub-micron (DSM) process, scaled-down devices, thinner gate oxides, lightly-doped drain regions (LDD), shallow trench isolation (STI) process and the metallic salicide process.

However, an ESD protection network typically consumes a large on-chip area and is limited to a semiconductor fabrication technology used to fabricate an IC. Thus, there is a need to provide a semiconductor structure for an ESD protection network that reduces on-chip layout area while providing protection against the ESD effects.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Various exemplary embodiments of the present disclosure are described in detail below with reference to the following figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAILED DESCRIPTION

Figure 1A:
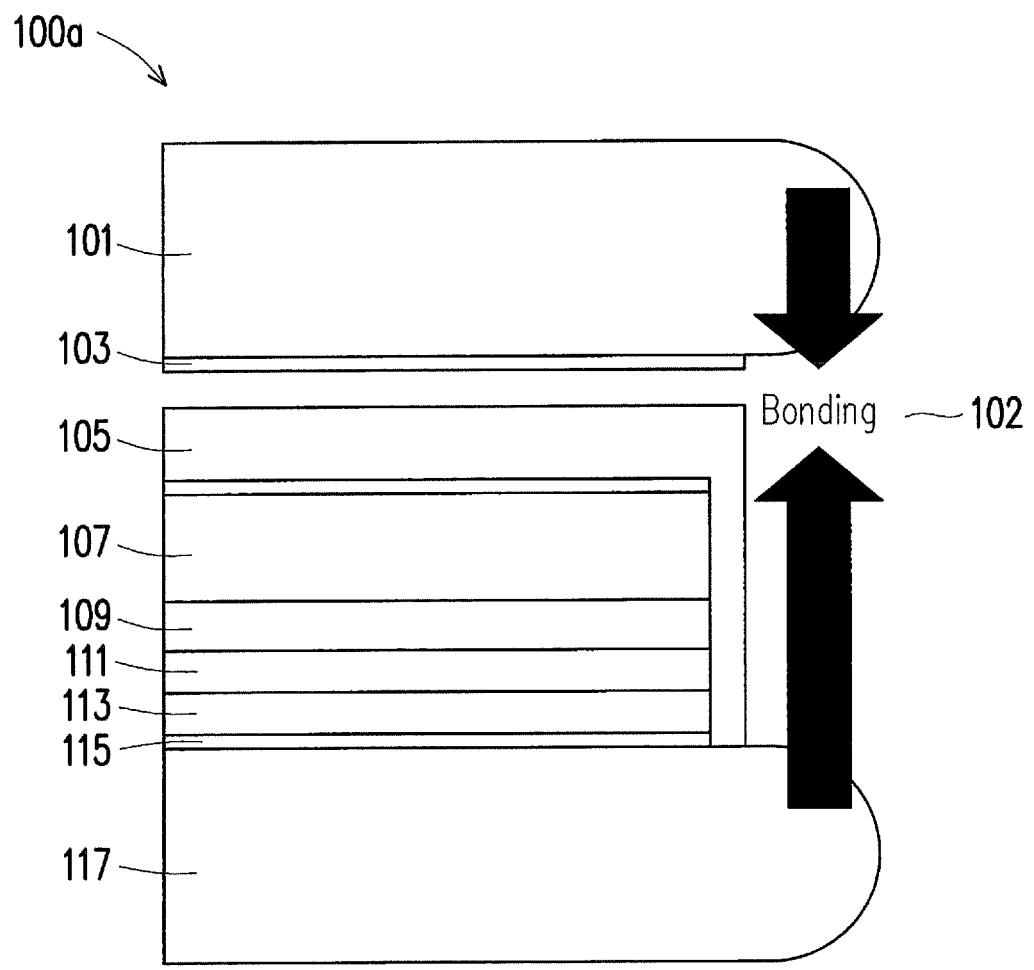
FIGS. 1A-1C illustrate cross-sectional views of an exemplary wafer stack for implementing ESD protection circuitry, in accordance with some embodiments of the present disclosure.

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

FIG. 1 illustrates a cross-sectional view of an exemplary wafer stack 100a for implementing ESD protection circuitry in a wafer 101 according to some embodiments. In some embodiments, during the bonding process 102, the front surfaces of the wafer 101 and a different wafer 117 are placed in contact with one another and bonded via thermal compression bonding. In some exemplary wafer stack formation process, the wafer 101 may be bonded to a High Density Plasma (HDP) oxide layer 105 during a wafer bonding process 102. In further embodiments, the wafer 101, having an array of ESD protection circuits patterned within, may include insulating materials such as silicon dioxide (SiO$_2$) deposited on its front surface. As described above, the front surface of the wafer 101 having a thin insulating material 103 deposited on its surface may be bonded with the surface of the wafer 117. In some embodiments, the thin insulating material 103 may have a thickness of approximately 350 angstroms (Å).

In some embodiments, the wafer 117 includes internal circuits and/or other semiconductor devices, while the wafer 101 includes the array of ESD protection circuits configured for protecting the circuits/devices in the wafer 117 from a transient ESD event. As such, the wafer 117 may be referred to as a device wafer, and the wafer 101 may be referred to as a protection wafer. The wafer 101 may also be referred to as a carrier wafer, as the wafer 101 can carry the device wafer such that the device wafer can be flipped over safely after bonding. To be distinguished from a conventional carrier wafer, the carrier wafer disclosed in the present teaching not only serves to carry the device wafer, but also provides ESD protection circuits to protect the circuits/devices in the device wafer from any transient ESD event. As such, the carrier wafer 101 will not be discarded after wafer bonding and flipping, and will continue to provide ESD protection to the device wafer.

In some embodiments, the wafer stack 100a for implementing ESD protection circuitry in the carrier wafer 101 may use a back end-of-line ("BEOL") fabrication process to fabricate a first conductive interconnect layer 107. As such, the first conductive interconnect layer 107 may be used to interconnect components of integrated circuits (ICs) and other microdevices patterned on the device wafer 117. In other embodiments, the first conductive interconnect layer 107 may include contacts (pads), interconnect wires, and vertical conductive paths (vias) suitable for interconnecting the integrated circuits (ICs) and other microdevices patterned on the device wafer 117 to the array of the ESD protection circuits patterned on the carrier wafer 101. In further embodiments, the BEOL fabrication process may use a conductive material, such as aluminum (Al), copper (Cu) or a Cu-based alloy, to create metallization lines and vias in the first conductive interconnect layer 107. Moreover, in deep-submicron BEOL processes, the conductive interconnect layer 107 may be insulated using the HDP oxide 105 that exhibits a good gap filling capability, low dielectric constant, and a low defect density. In some embodiments, the first conductive interconnect layer 107 may have a thickness of approximately 28,000 to 30,000 Å. In some embodiments, a higher thickness of the first conductive interconnect layer 107 can induce lower conductive resistance and better thermal dissipation. In some embodiments, the first conductive interconnect layer 107 includes a plurality of metal layers M0 to Mtop, with a total number of metal layers in a range from 6 to 20 in the first conductive interconnect layer 107.

In further embodiments, the wafer stack 100a may use a mid-end-of-line ("MEOL") fabrication process to fabricate a second conductive interconnect layer 109. In some embodiments, the second conductive interconnect layer 109 may include gate contacts as well as contact structures in the source and drain regions of the device wafer 117. In various embodiments, the second conductive interconnect layer 109 may have a thickness in the range of 450 to 550 Å (e.g., 500 Å). In some embodiments, a higher thickness of the second conductive interconnect layer 109 can lead to a stronger ESD robustness.

As shown in FIG. 1A, the wafer stack 100a may include a layer of epitaxial growth and a first interlayer dielectric (ILD) 111. In some embodiments, the first ILD may be, for example, an oxide, i.e. SiO2, or a low k dielectric material, which may be deposited using any conventional deposition process, for example, atomic layer deposition (ALD), chemical vapor deposition (CVD), or physical layer deposition (PVD). In various embodiments, the layer of epitaxial growth and the ILD may have a thickness in the range of 1100 to 1300 (e.g., 1200) Å.

In further embodiments, the wafer stack 100a may include a silicon (Si) layer 113 formed on top of an insulator layer 115 deposited over the substrate of the device wafer 117. In various embodiments, the Si layer 113 may include a crystalline silicon. As such, semiconductor devices, such as transistors, may be capable of being fabricated in the crystalline silicon. In some embodiments, the Si layer 113 may have a thickness in the range of 350 to 450 Å (e.g., 400 Å) and the insulator layer 115 may have a thickness in the range of 180 to 220 Å (e.g., 200 Å). In some embodiments, for a 12-inch wafer, the total thickness of the Si layer 113 and the insulator layer 115 is less than about 0.775 mm.

Figure 1B:
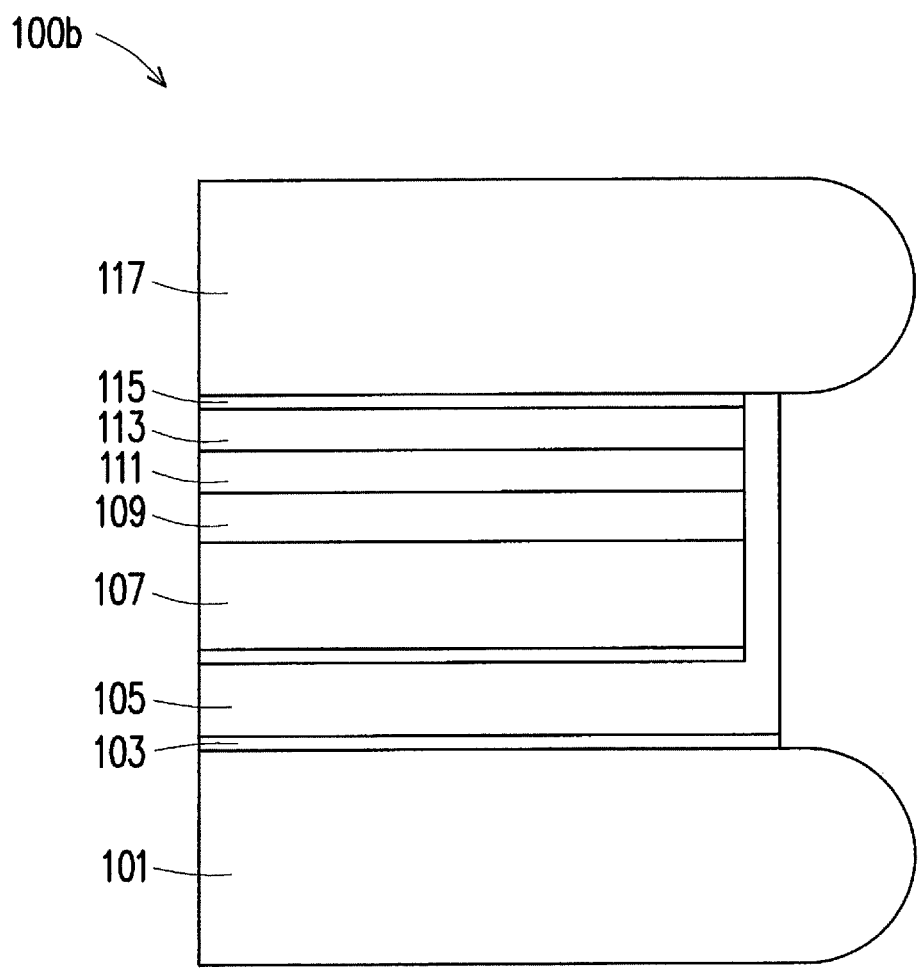
Figure 1C:
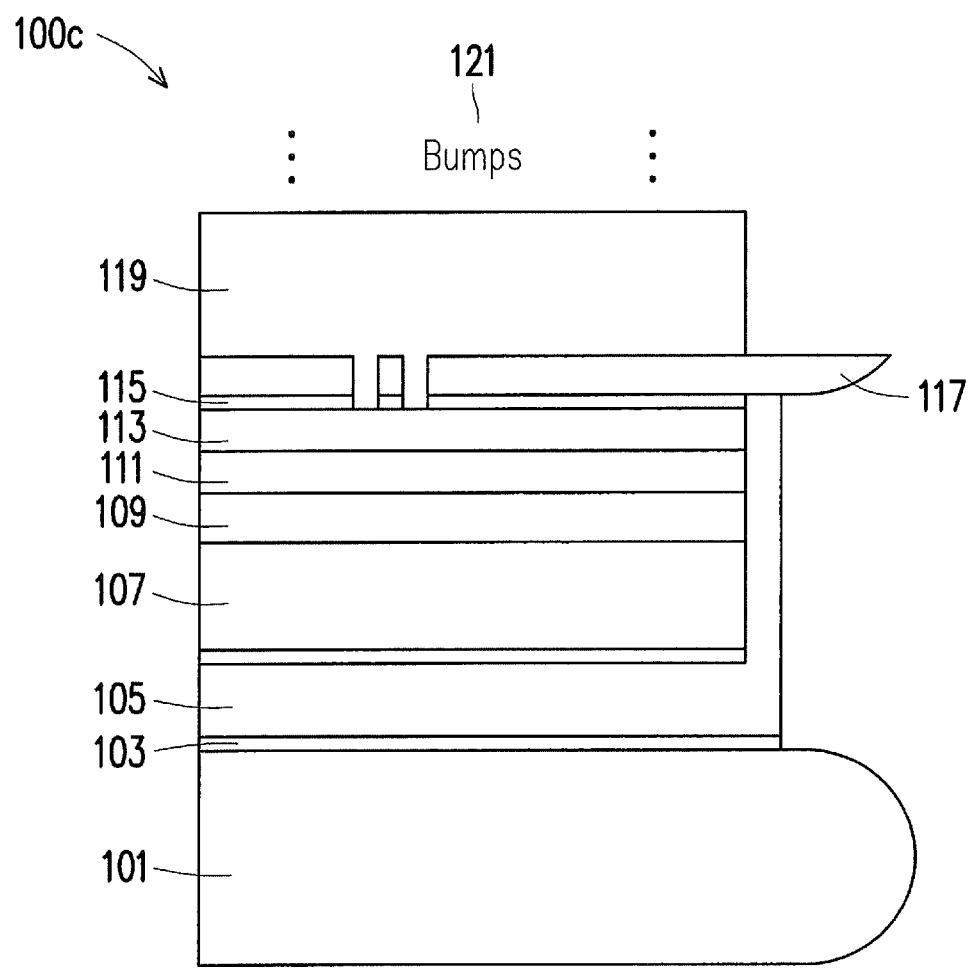

In various embodiments, the wafer stack 100a may also be flipped to facilitate a flip-chip packaging. As shown in FIG. 1B, after the wafer bonding, the wafer stack 100a is flipped to form the wafer stack 100b. Then, as shown in FIG. 1C, after the flipping, the device wafer 117 is etched and polished to fabricate a third conductive interconnect layer 119 using a BEOL fabrication process in the wafer stack 100c. This may be performed by an etching process, a polishing process or a thinning process. The third conductive interconnect layer 119 may be used to interconnect components of integrated circuits (ICs) and other microdevices patterned on the device wafer 117. In other embodiments, the third conductive interconnect layer 119 may include contacts (pads), interconnect wires, and vertical conductive paths (vias) suitable for interconnecting the integrated circuits (ICs) and other microdevices patterned on the device wafer 117, e.g. in the Si layer 113, to upper packaging via solder bumps 121. In further embodiments, the BEOL fabrication process may use a conductive material, such as aluminum (Al), copper (Cu) or a Cu-based alloy, to create metallization lines and vias in the third conductive interconnect layer 119.

In some embodiments, the third conductive interconnect layer 119 serves as a back-end-of-line (BEOL) layer formed at backside of the wafer. In some embodiments, the third conductive interconnect layer 119 may have a thickness of approximately 28,000 to 30,000 Å. In some embodiments, the third conductive interconnect layer 119 includes a plurality of metal layers M0 to Mt, with a total number of metal layers in a range from 2 to 20 in the third conductive interconnect layer 119.

In some embodiments, after the wafer bonding and flipping, an etching process, a polishing process or a thinning process is performed on the carrier wafer 101 to reduce its thickness. Since the carrier wafer 101 here includes ESD protection circuits, the carrier wafer 101 will not be totally removed after the thinning process, and the ESD protection circuits are not impacted by the thinning.

Figure 2:
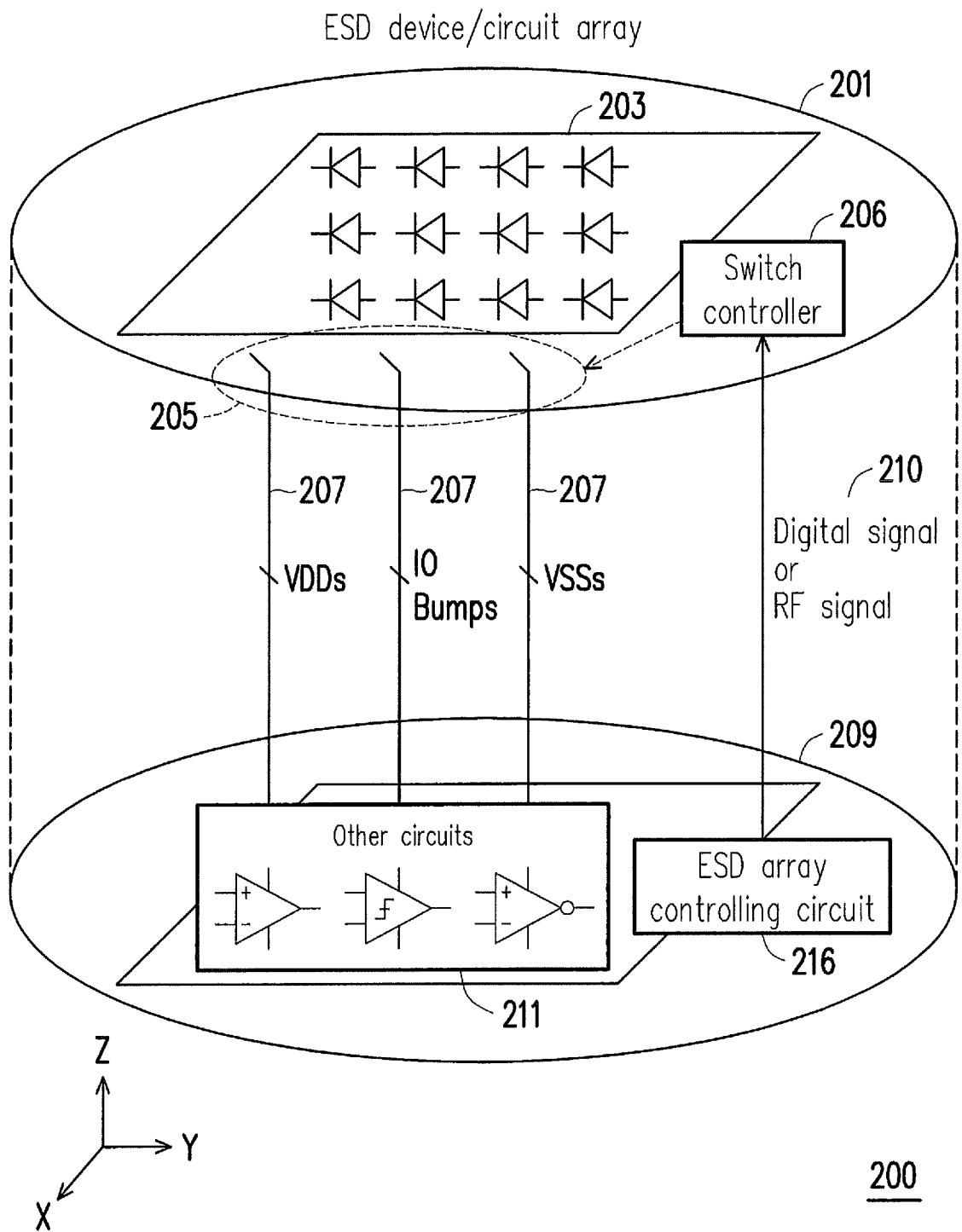
FIG. 2 illustrates a schematic diagram of an ESD circuit array with circuit controlled switches, in accordance with some embodiments of the present disclosure.

FIG. 2 illustrates a schematic diagram of an array of ESD protection circuits 203 with circuit controlled switches 205 implemented in a carrier wafer 201, in accordance with some embodiments of the present disclosure. In some embodiments, the array of ESD protection circuits 203 may be patterned on the carrier wafer 201 and configured to divert damaging ESD pulses from an array of sensitive devices 211 patterned on a device wafer 209. Moreover, the array of ESD protection circuits 203 patterned on the carrier wafer 201 may save a critical device wafer area for various integrated circuits and microdevices by fabricating large ESD protection circuits on the carrier wafer 201.

In various embodiments, the carrier wafer 201 may be fabricated from various materials including silicon, soda lime glass, borosilicate glass, sapphire, and various metals and ceramics. Moreover, the carrier wafer 201 may be square or rectangular and may be sized to match the device wafer 209. The device wafer 209 includes the array of devices 211 comprising of integrated circuits, internal circuits, MEMS, microsensors, power semiconductors, light-emitting diodes, photonic circuits, interposers, embedded passive devices, and/or other microdevices fabricated on or from silicon and other semiconducting materials such as silicon-germanium, gallium arsenide, and gallium nitride. In further embodiments, the array of devices 211 can also include raised structures such as solder bumps and metal posts and pillars.

In some embodiments, the array of ESD protection circuits 203 patterned on the carrier wafer 201 may include the ESD circuit array discussed with respect to FIGS. 4, 5, 6A, 6B, and 6C below or any other ESD protection circuitry. Moreover, the patterned array of ESD protection circuits 203 may include devices such as zener diodes, metal oxide varistors (MOVs), transient voltage suppression (TVS) diodes, and regular complementary metal oxide semiconductor (CMOS) or bipolar clamp diodes.

In some embodiments, the array of ESD protection circuits 203 includes a plurality of ESD protection devices and switches 205 coupled to the ESD protection devices. In further embodiments, each of the switches 205 can be turned on to activate a corresponding ESD protection device, and turned off to deactivate the corresponding ESD protection device.

In further embodiments, the carrier wafer 201 includes a switch controller 206 configured to control the switches 205 to be turned on or off based on a control signal 210 from the device wafer 209. As such, by controlling the switches 205, the switch controller 206 is configured to control each of the plurality of ESD protection devices in the ESD protection circuits 203 to be activated or deactivated by the corresponding switch. The activated ESD protection devices can protect the array of sensitive devices 211 from a transient ESD event. In various embodiment, the switch controller 206 is part of or separate from the ESD protection circuits 203 in the carrier wafer 201. In one embodiment, the switch controller 206 is located beside the ESD protection circuits 203 in the carrier wafer 201.

In further embodiments, the device wafer 209 includes an ESD array controlling circuit 216, which is part of the array of sensitive devices 211 or separate from the array of sensitive devices 211. The ESD array controlling circuit 216 determines a quantity of ESD protection devices to be activated among the plurality of ESD protection devices in the ESD protection circuits 203, e.g. based on customer input or customer requirement. For example, the ESD array controlling circuit 216 may determine the quantity of ESD protection devices to be activated based on a program with input information related to customer requirement.

In some embodiments, the ESD array controlling circuit 216 is configured to generate the control signal 210 based on the quantity, and send the control signal 210 to the switch controller 206 for controlling the switches 205, as the device wafer 209 is bonded to the carrier wafer 201. In various embodiments, the control signal 210 is one of: a digital signal or a radio frequency signal. Based on the control signal 210, the switch controller 206 is configured to control a number of ESD protection devices to be activated by the corresponding switch among the plurality of ESD protection devices. The activated ESD protection devices are configured to clamp an ESD voltage during an ESD event so as to protect the integrated circuits 211 from the ESD event.

In further embodiments, electrical connections 207 between the array of ESD protection circuits 203 patterned on the carrier wafer 201 and the array of sensitive devices 211 patterned on the device wafer 209 may be provided. In some embodiments, the electrical connections 207 may be solder balls, bumps, columns, pillars, or other structures formed from a conductive material, such as solder, metal, or metal alloy to facilitate electrical connections. In some embodiments, the electrical connections 207 may facilitate electrical connections of the array of ESD protection circuits 203 and the array of sensitive devices 211 to a power supply node VDD, to a ground node VSS, as well as to input/output pins. In further embodiments, the switches 205 can be turned on or off by the switch controller 206 to activate part or all of the ESD protection devices in the circuit array 203. While an activated ESD protection device is electrically connected to the power supply node VDD, the ground node VSS, as well as the input/output pins by the electrical connections 207, a deactivated ESD protection device is electrically disconnected from at least one of the power supply node VDD, the ground node VSS, or the input/output pins.

With the circuit controlled switches 205 in the carrier wafer 201, the ESD array controlling circuit 216 is programmable to determine the number of ESD protection devices to be activated among the plurality of ESD protection devices, and is configured to generate the control signal 210 to indicate the number. A larger number of activated ESD protection devices in the array of ESD protection circuits 203 can provide a stronger ESD robustness to the array of sensitive devices 211, but may generate a larger parasitic capacitance in the integrated circuits. In contrast, a smaller number of activated ESD protection devices in the array of ESD protection circuits 203 can lead to a smaller parasitic capacitance in the integrated circuits, but cannot provide a strong ESD robustness to the array of sensitive devices 211. With a programmable ESD array controlling circuit 216, a certain ESD resistance level may be secured based on customer requirement or customer input, without inducing a large parasitic capacitance.

In further embodiments, the carrier wafer 201 and the device wafer 209 are divided into a plurality of dies or a plurality of ICs. The array of ESD protection circuits 203, the array of sensitive devices 211, the ESD array controlling circuit 216 and the switch controller 206 are located in each die or each IC.

Figure 3A:
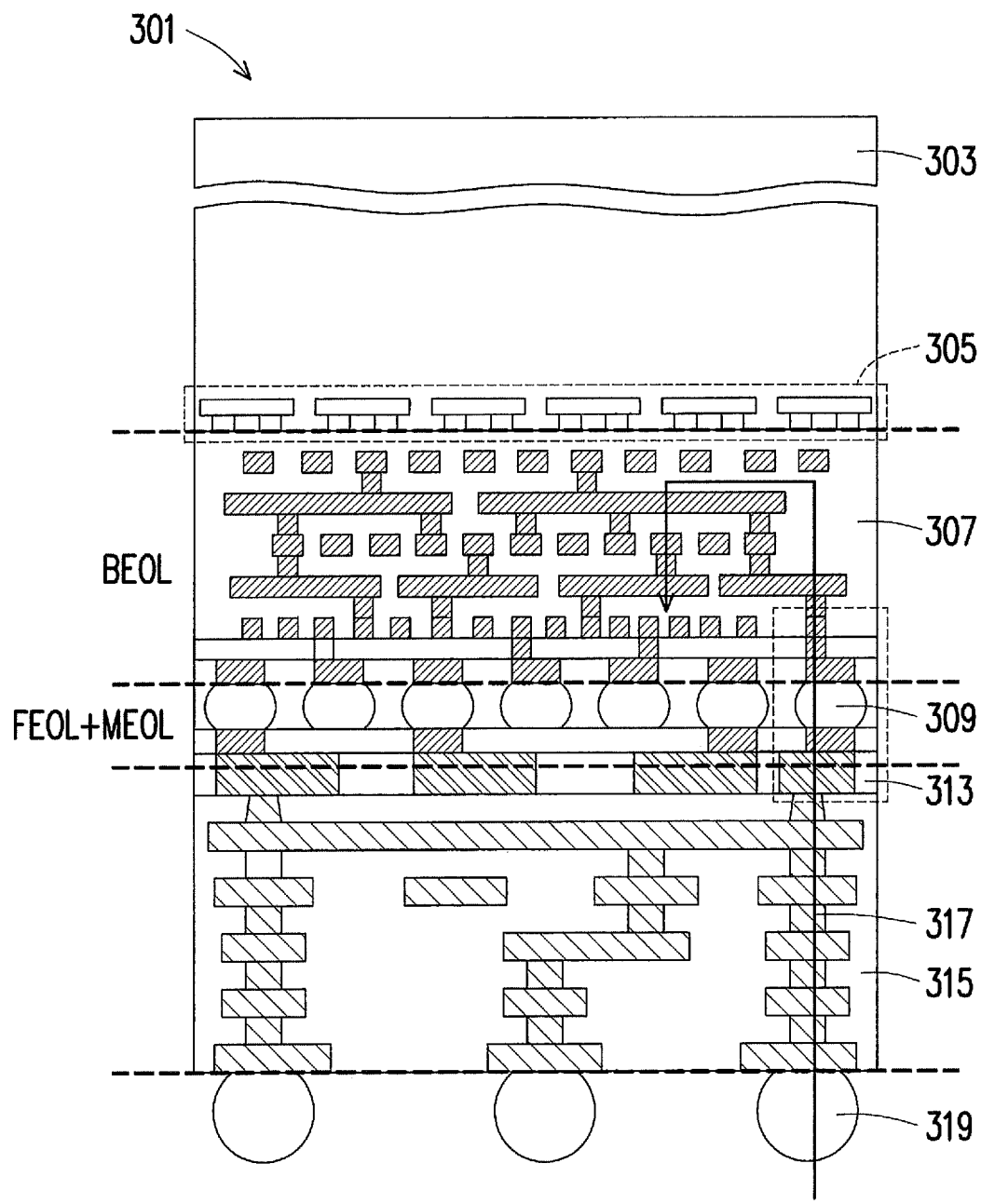
FIG. 3A illustrate a cross-sectional view of a semiconductor device with an ESD array, in accordance with some embodiments of the present disclosure.

FIG. 3A illustrate a cross-sectional view of a semiconductor device 301 with an ESD array 305 implemented in a carrier wafer 303, in accordance with some embodiments of the present disclosure. As shown in FIG. 3A, the ESD array 305 implemented in the carrier wafer 303 increases the routing resources in the device wafer thereby freeing up a space for integrating more functionality into the semiconductor device 301. In some embodiments, a switch controller is part of or beside the ESD array 305 in the carrier wafer 303, to control switches in the ESD array 305 for activating or deactivating the ESD protection devices in the ESD array 305.

According to one embodiment, the semiconductor device 301 may include a back-end-of-line (BEOL) layer 307 comprising contacts, insulating layers, multiple metal levels, and bonding sites configured to interconnect integrated circuits and microdevices fabricated in a front-end-of-line ("FEOL") portion of a FEOL and mid-end-of-line ("MEOL") portion of layer 309. In some embodiments, the BEOL layer 307 is formed under the array of ESD protection circuits.

In some embodiments, FEOL portion of the layer 309 comprises a semiconductor substrate and the interconnect rails that are partially buried in the semiconductor substrate. In some embodiments, the MEOL portion of the layer 309 may include gate contacts as well as contact structures connected to the source and drain regions of the integrated circuits formed in the FEOL portion of the layer 309. In some embodiments, the FEOL and MEOL layer 309 is formed under the BEOL layer 307. In some embodiments, the FEOL and MEOL layer 309 includes an ESD array controlling circuit to determine a number of ESD protection devices to be activated in the ESD array 305.

In various embodiments, the semiconductor device 301 may include a power delivery network ("PDN") layer 315 that is formed for delivering power to the individual integrated circuits and microdevices. In some embodiments, the PDN layer 315 is formed under the front-end-of-line ("FEOL") and mid-end-of-line ("MEOL") layer 309. In some embodiments, the PDN layer is formed as part of the device layer 117 of FIG. 1. Moreover, the power delivery network in the PDN layer 315 may be connected to the buried interconnect rails of the FEOL layer by way of metal-filled TSVs (Through-Semiconductor Vias) or by way of damascene-type contacts. Moreover, the FEOL and MEOL layer 309 may also include layer interconnect vias 313 configured to route signals from the PDN layer 315 to the BEOL layer 307. In some embodiments, the layer interconnect vias 313 may be shielded from the integrated circuits and their interconnects formed in the FEOL and MEOL layer 309.

In further embodiments, the semiconductor device 301 may also include multiple solder bump terminals 319, called bump pads, which are used as the input/output (I/O) terminals as well as power supply (VDD and VSS) contacts. In one embodiment, the solder bump pads 319 may be formed over the bottom surface of the PDN layer 315. In some embodiments, the solder bump pads 319 may be linearly aligned bump pad arrays, where each linearly aligned bump pad array may have one or more I/O bump pads, one or more VDD bump pads, and one or more VSS bump pads.

As illustrated in FIG. 3A, during an ESD event, an ESD signal 317 may be routed through the PDN layer 315, the FEOL and MEOL layer 309, and the BEOL layer 307 to the ESD array 305 thereby protecting internal integrated circuits and microdevices from an ESD event occurring at the bump pads 319. Some exemplary advantages of the structure shown in FIG. 3A may include an ESD signal routing approach to the ESD array 305 that minimizes the effects of parasitic discharge elements that may be present inside the internal integrated circuits and microdevices. For example, the ESD signal 317 routing approach shown in FIG. 3A shields the internal integrated circuits from the parasitic discharging elements present in the FEOL and MEOL layer 309. Additionally, the structure of FIG. 3A may provide a customized metal routing/scheme for the ESD signal 317. Another exemplary advantage of the structure shown in FIG. 3A includes an increase of the routing resources in the device wafer that can be used for application specific circuits. Another exemplary advantage of the structure shown in FIG. 3A includes programmable control of a certain ESD protection level for the internal integrated circuits with limited power consumption and limited parasitic capacitance of the ESD array 305.

Figure 3B:
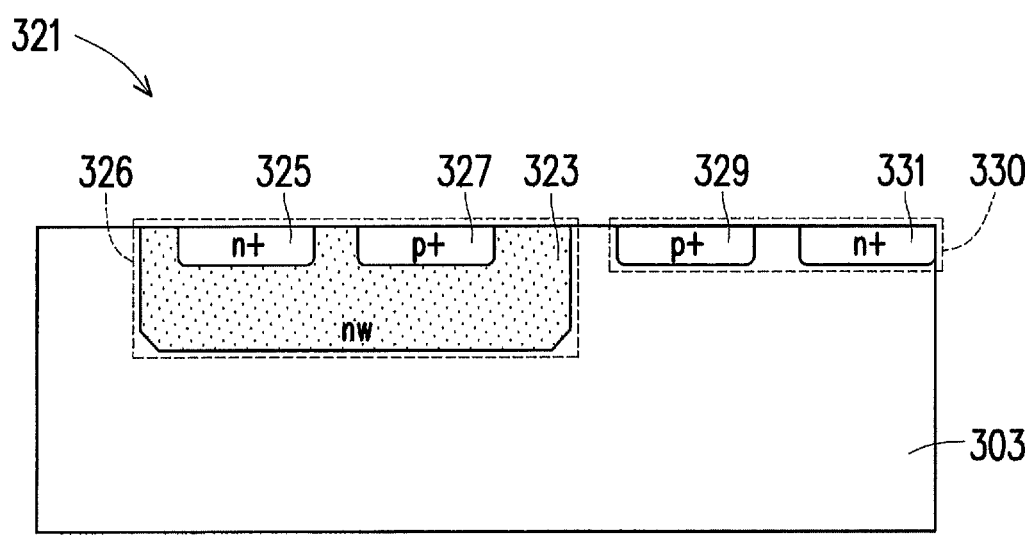
FIG. 3B illustrates a cross-sectional view of a portion of an ESD array, in accordance with some embodiments of the present disclosure.

FIG. 3B illustrates a cross-sectional view of a portion of an ESD array 321 implemented in a carrier wafer 303, in accordance with some embodiments. As such, the exemplary portion of the ESD array 321 shown in the FIG. 3B includes one or more diodes formed in a silicon substrate 303 of the carrier wafer. Moreover, at least one of the one or more diodes may be n-type diode. In this regard, an n-type diode 326 may be formed within an n-well region 323. In some embodiments, the n-well region 323 may be doped simultaneously with the doping step employed to produce n-wells in the substrate for fabricating PMOS circuits and thus no additional fabrication steps need to be added to a standard complementary metal-oxide semiconductor (CMOS) fabrication process. In some embodiments, the n-well region 323 of the n-type diode 326 may include a cathode 325 and an anode 327 region. The cathode region 325 may be doped with n-type dopant and the anode region 327 may be doped with p-type dopant. In some embodiments, p-type dopants may be chosen from the Group III elements (such as boron, gallium, etc.) and n-type dopants may be chosen from the Group V elements (such as arsenic and phosphorus, etc.). As another example, the ESD array 321 may also include a p-type diode 330 formed in the substrate 303 of the carrier wafer. As illustrated in FIG. 3B, the p-type diode 330 may be constructed between an anode p+ doped region 329 and a cathode n+ doped area 331.

Figure 4A:
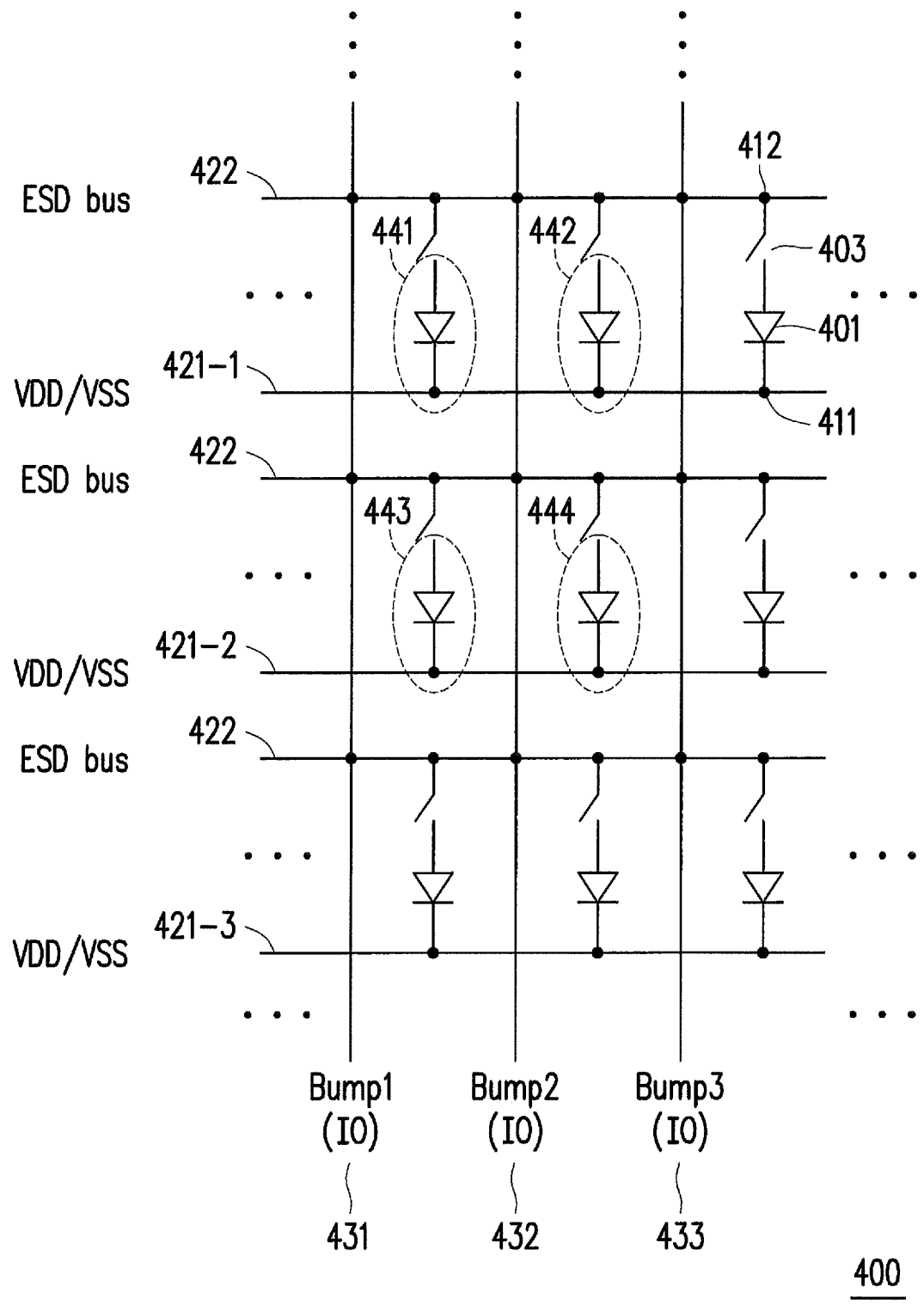
FIG. 4A illustrates a schematic circuit diagram of an ESD circuit array, in accordance with some embodiments of the present disclosure.

FIG. 4A illustrates a schematic circuit diagram of an ESD circuit array 400, in accordance with some embodiments of the present disclosure. In some embodiments, the ESD circuit array 400 may be implemented as at least part of the array of ESD protection circuits 203 in FIG. 2 or as the ESD array 305 in FIG. 3.

As shown in FIG. 4A, the ESD circuit array 400 comprises an array of diodes 401 electrically coupled in parallel between a power supply rail 421 and a ESD bus line 422. In some embodiments, the power supply rail 421 is a high power supply rail or a low power supply rail. In some embodiments, the high power supply rail is connected to a supply voltage, "VDD," at a power supply VDD node (e.g., a terminal or an input pad); and the low power supply rail is connected to a lower voltage, "VSS," at a voltage VSS node, which is set to a voltage that is zero (the ground) or around zero. In the embodiment shown in FIG. 4A, the ESD circuit array 400 includes a power supply rail 421-1 connected to a power supply node VDD, a power supply rail 421-2 connected to a ground node VSS, and a power supply rail 421-3 connected to either VDD or VSS upon selection.

In further embodiments, each of the diodes 401 is electrically coupled between a first node 411 and a second node 412 when being activated by a corresponding switch 403. The corresponding switch 403 is electrically connected to the diode 401 in series. The first node 411 is connected to the power supply rail 421; and the second node 412 is connected to the ESD bus line 422. For each diode 401, one terminal of the diode 401 is electrically coupled to one of the power supply rails 421; the other terminal of the diode 401 is electrically coupled to one of the ESD bus lines 422 via the corresponding switch 403.

In some embodiments, the activated diodes connected to the low power supply rail 421-2 are ESD protection devices configured to provide a pathway for an ESD current to flow to the low power supply rail 421-2. In some embodiments, the activated diodes connected to the high power supply rail 421-1 are ESD protection devices configured to provide a pathway for an ESD current to flow to the ESD bus line 422. In further embodiments, the ESD bus lines 422 are electrically coupled to each other and electrically coupled to an input/output (I/O) bump pad 431, 432, 433. In further embodiments, the power supply rails 421 are electrically coupled to each other or have a same voltage.

Figure 4B:
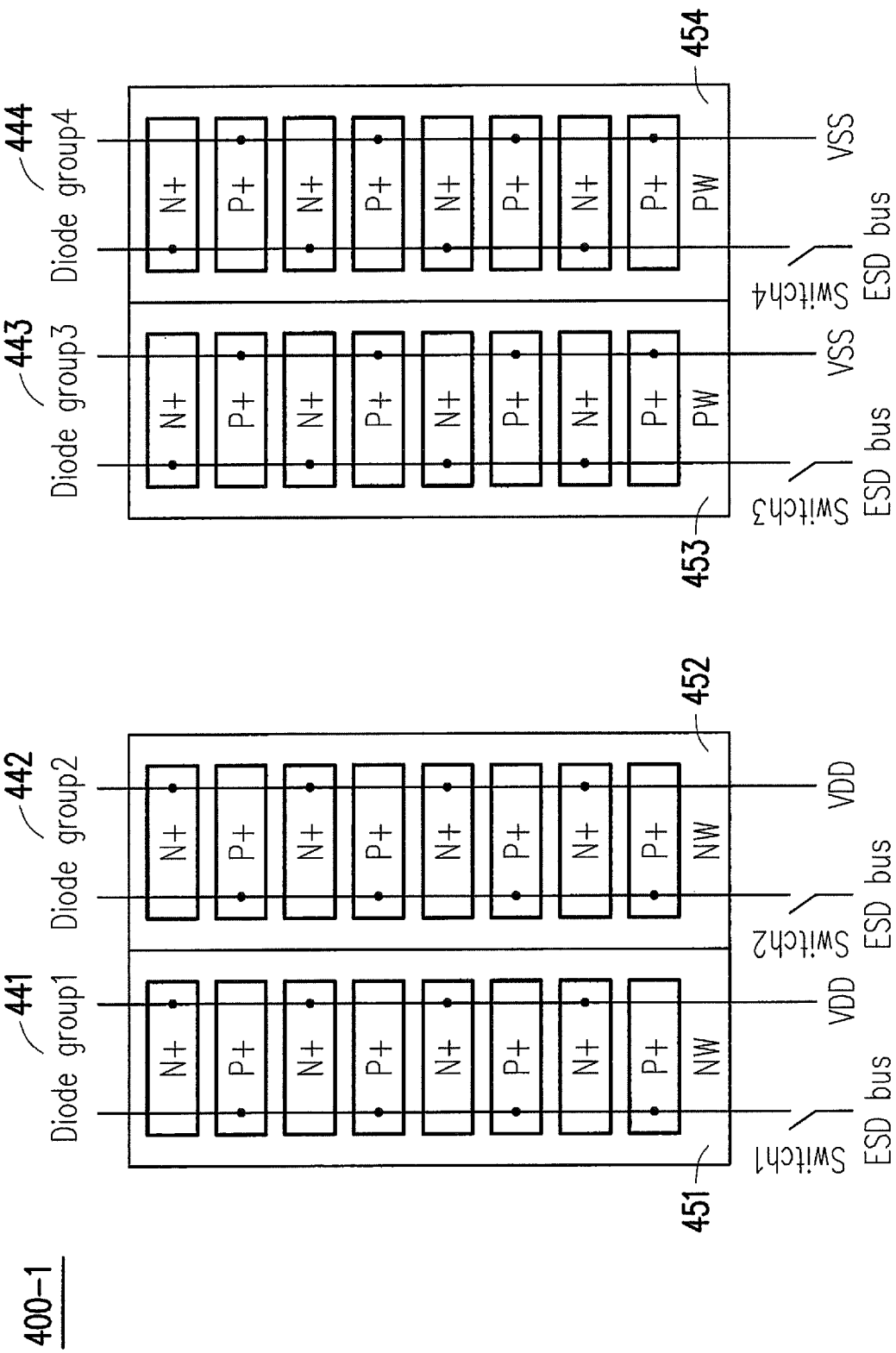
FIG. 4B illustrates a top view of a partial layout of an ESD circuit array, in accordance with some embodiments of the present disclosure.

In some embodiments, each of the diodes 401 represents a diode group formed by connecting a plurality of diodes in parallel. FIG. 4B illustrates a top view of a partial layout 400-1 of an ESD circuit array, e.g. the ESD circuit array 400 in FIG. 4A, in accordance with some embodiments of the present disclosure. The partial layout 400-1 includes a layout of four diode groups 441, 442, 443, 444 corresponding to the diodes 441, 442, 443, 444 shown in FIG. 4A.

As shown in FIG. 4B, each of the diode groups 441, 442, 443, 444 includes multiple diodes connected in parallel. For example, the diode group 1 441 includes n-type diodes formed in an n-well region 451 and connected between the ESD bus and VDD in parallel; the diode group 2 442 includes n-type diodes formed in an n-well region 452 and connected between the ESD bus and VDD in parallel; the diode group 3 443 includes p-type diodes formed in a p-well region 453 and connected between the ESD bus and VSS in parallel; and the diode group 4 444 includes p-type diodes formed in a p-well region 454 and connected between the ESD bus and VSS in parallel. A cross-sectional view of an n-type diode can be referred to the n-type diode 326 in FIG. 3B. In some embodiments, the diode groups 441, 442, 443, 444 are also connected to each other in parallel, where each diode group is separately activated or deactivated b a respective switch. In other embodiments of the present teaching, there may be multiple metal lines for interconnections of the diodes in FIG. 4B in order to discharge the current smoothly.

Figure 5:
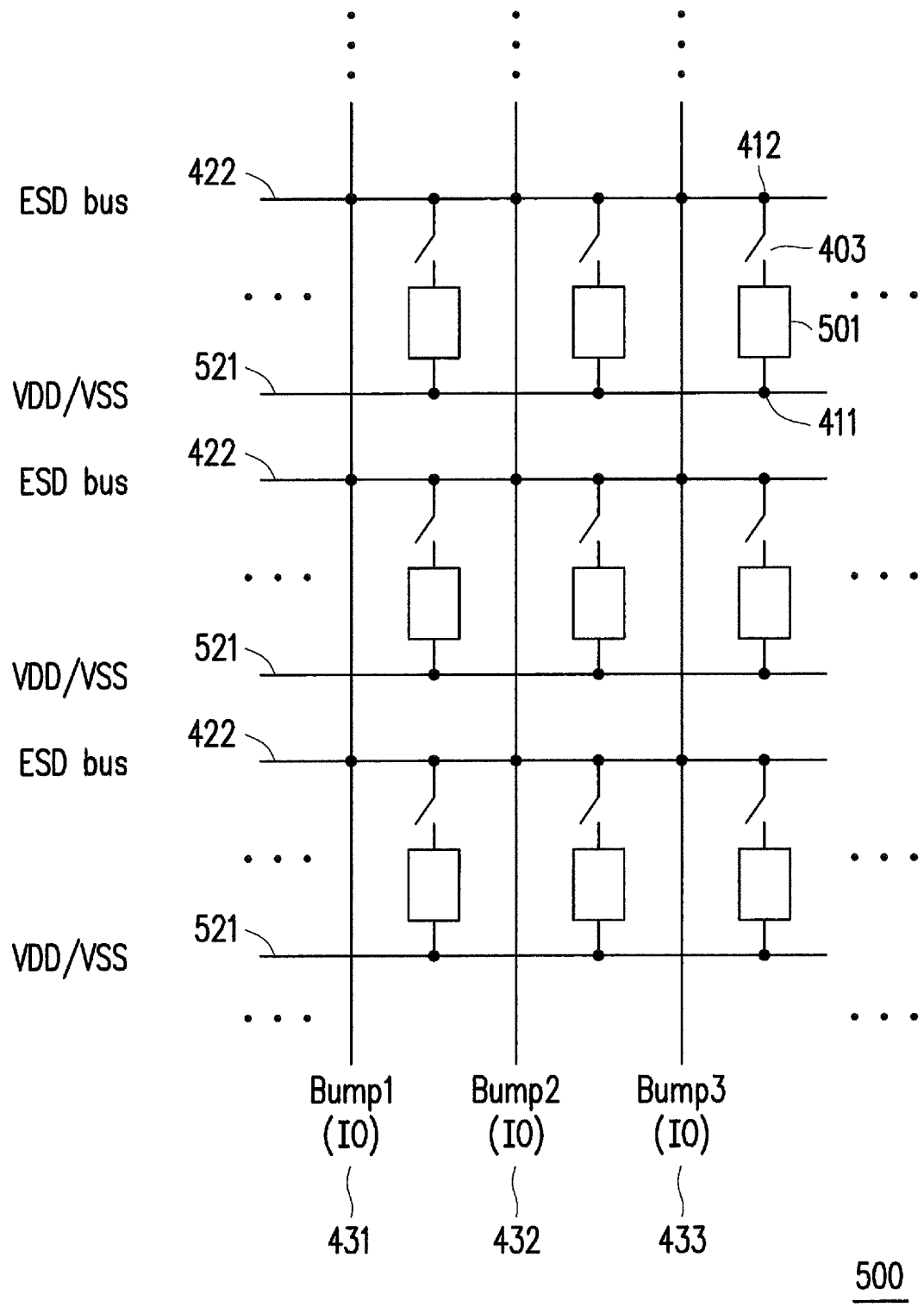
FIG. 5 illustrates another schematic circuit diagram of an ESD circuit array, in accordance with some embodiments of the present disclosure.

FIG. 5 illustrates another schematic circuit diagram of an ESD circuit array 500, in accordance with some embodiments of the present disclosure. In some embodiments, the ESD circuit array 500 may be implemented as at least part of the array of ESD protection circuits 203 in FIG. 2 or as the ESD array 305 in FIG. 3.

Figure 6A:
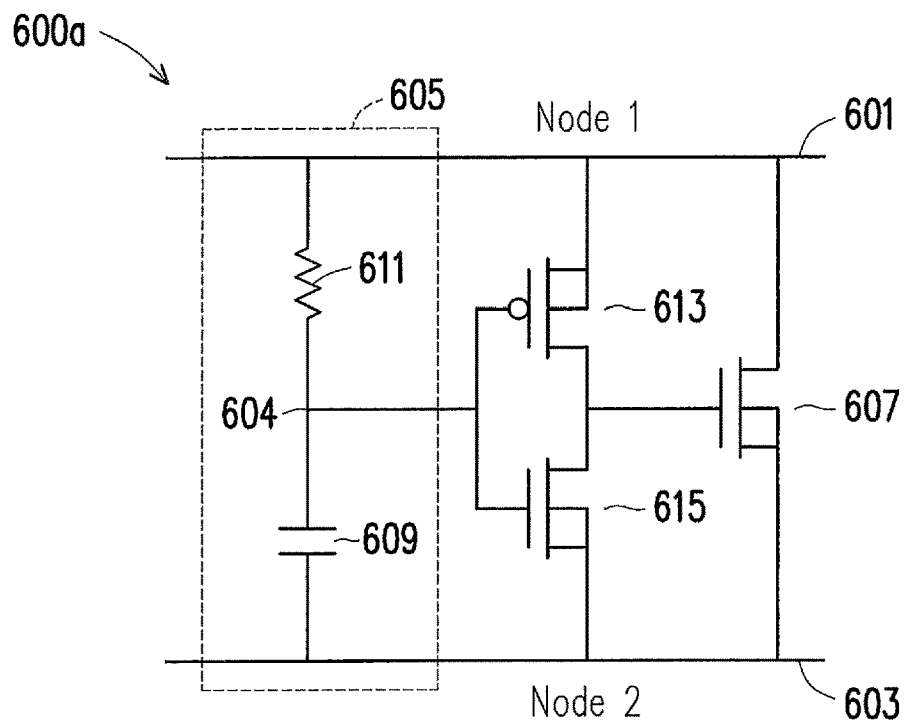
FIGS. 6A-6C illustrate exemplary ESD power clamp circuits, in accordance with some embodiments of the present disclosure.
Figure 6B:
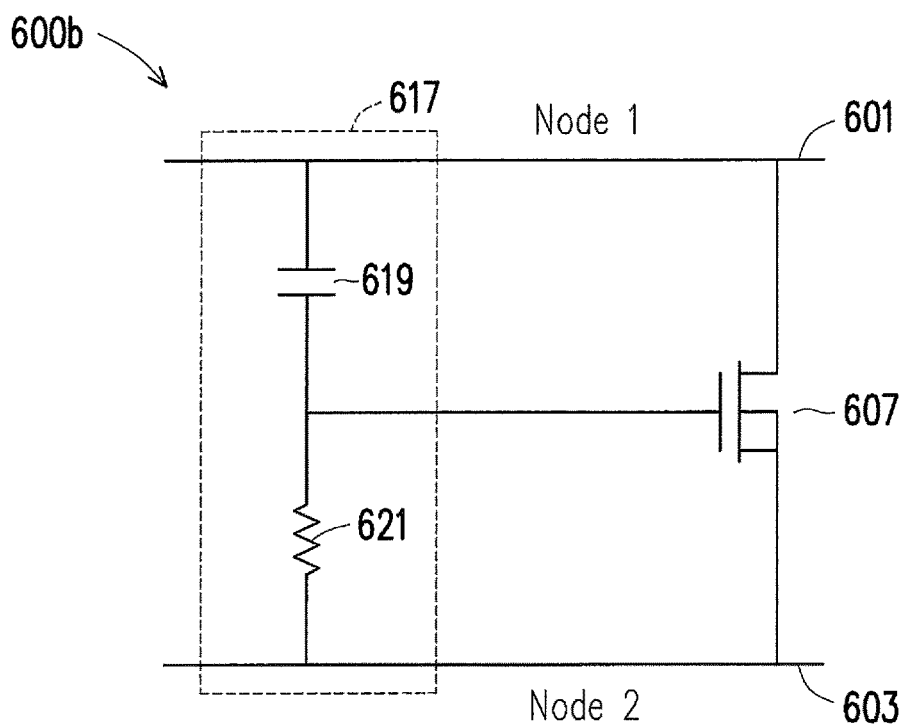
Figure 6C:
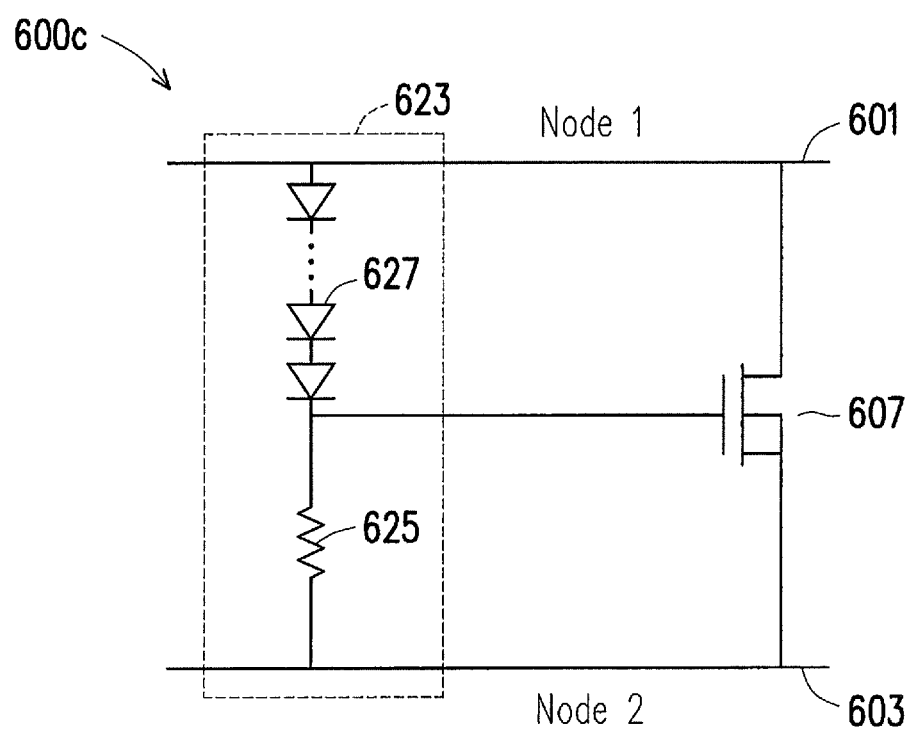

The ESD circuit array 500 in FIG. 5 has a same structure as the ESD circuit array 400 in FIG. 4A, except that the ESD circuit array 500 comprises an array of two-terminal devices 501, which may not be diodes, electrically coupled in parallel between a power supply rail 521 and a ESD bus line 422. Each power supply rail 521 in FIG. 5 may be a high power supply rail connected to VDD or a low power supply rail connected to VSS. In general, the array of two-terminal devices 501 patterned in the carrier wafer may be implemented as any array of ESD power clamp circuits. In FIG. 5, each two-terminal device 501 serves as a ESD protection device having two terminals, where a first terminal of the two terminals is electrically coupled to one of the power supply rails 521; and a second terminal of the two terminals is electrically coupled to one of the ESD bus lines 422 via the corresponding switch 403. FIGS. 6A-6C illustrate exemplary ESD power clamp circuits that may be implemented as the two-terminal device 501 in FIG. 5, in accordance with some embodiments of the present disclosure.

FIG. 6A illustrates an ESD power clamp circuit 600a that can be implemented as part of an ESD array, as discussed in any of the above mentioned embodiments, formed on a carrier wafer, in accordance with some embodiments. In some embodiments, the ESD power clamp circuit 600a includes a high-current-capacity field-effect transistor (FET) 607 electrically connected across two nodes 601 and 603. In some embodiment, while one of the two nodes 601 and 603 is a high (e.g., a VDD pin) or low (e.g., a VSS pin) power supply node, the other of the two nodes 601 and 603 is connected to a ESD bus line. In accordance with other embodiments, the ESD power clamp circuit 600a may include a plurality high-current-capacity field-effect transistors (FETs) connected in series between the nodes 601 and 603. In further embodiments, the FET transistor 607 may provide a current path for discharging current from the first node 601 during an ESD event. As such, the FET transistor 607 may have a channel width on the order of 2,000 micrometer (μm) to 9,000 micrometer (μm) in order to handle the large current present during an ESD event.

Moreover, as shown in FIG. 6A, the ESD power clamp circuit 600a includes an RC trigger network 605 comprising of a capacitor 609 in series with a resistor 611. The RC trigger network 605 is connected between the nodes 601 and 603. The ESD power clamp circuit 600a further includes two transistors 613 (e.g., PMOS) and 615 (e.g., NMOS) forming an inverter. In some embodiments, the gates of the transistors 613 and 615 are commonly coupled to a node 604. When an ESD event occurs and the voltage at the first node 601 rises against the voltage at the second node 603. In addition, during an ESD event, the voltage of the node 604 is kept closed to voltage of the second node 603 due to slow response of the capacitor 609 therefore causing the transistor 615 to turn off and the transistor 613 to turn on. Subsequently, the voltage at gate of the FET transistor 607 is pulled high by the turned-on transistor 613, and the FET transistor 607 is triggered to conduct current between the nodes 601 and 603 to provide an ESD clamping. In other embodiments, if the second node 603 is subjected to an ESD event, an ESD current may flow through the intrinsic body-diode of the FET transistor 607. In some embodiments, the ESD arrays 203, 305, 500 shown in FIGS. 2, 3A, 5, respectively may be implemented as an array of ESD power clamp circuits 600a patterned in the carrier wafer. As such, the array of the ESD power clamp circuits implemented in the carrier wafer can increase the routing resources in the device wafer for other application specific circuits.

FIG. 6B illustrates an exemplary ESD power clamp circuit 600b, in accordance with some embodiments. As shown in FIG. 6B, the ESD power clamp circuit 600b, includes a trigger network 617 comprising a resistor 621 connected in series with a capacitor 619. The trigger network 617 may be coupled between the nodes 601 and 603, respectively. Moreover, the trigger network 617 may drive a gate of the FET transistor 607 (FIG. 6A), e.g., an n-channel MOS (Metal-Oxide-Semiconductor) transistor during an ESD event. As such, when an ESD event occurs, the voltage of the first node 601 rises against the second node 603 and causes the FET transistor 607 to turned on. In some embodiments, the ESD arrays 203, 305, 500 shown in FIGS. 2, 3A, 5, respectively may be implemented as an array of ESD power clamp circuits 600b patterned in the carrier wafer.

FIG. 6C illustrates an exemplary ESD power clamp circuit 600c, in accordance with some embodiments. As shown in FIG. 6C, the ESD power clamp circuit 600c may include a diode based trigger network 623. In some embodiments, the diode based trigger network 623 may include one or more diodes 627 connected in series with their anodes oriented towards the first node 601 and their cathodes oriented towards the second node 603. Moreover, the diode based trigger network 623 may also include a resistor 625 connected between the one or more diodes 627 and the second node 603. In addition, the ESD power clamp circuit 600c may also include the FET transistor 607 (discussed in FIG. 6A) with its gate connected to node between the one or more diodes 627 and the resistor 625.

In operation, the diode based trigger network 623 is configured to drive the FET transistor 607 when the voltage across the resistor 625 reaches a predetermined level to turn on the FET transistor 607. As such, a trigger voltage that causes the FET transistor 607 to conduct current from the first node 601 to the second node 603 is determined by the number of the diodes 627 connected in series and the threshold voltage of the FET transistor 607. In this regard, during the ESD event, when the voltage on the first node 601 approaches the trigger voltage, the FET transistor 607 conduct a relatively large amount of current. Furthermore, in some embodiments, the trigger voltage can be programmed by adjusting the number of diodes, or by adjusting the breakdown voltage of one or more diodes 627 used in place of one or more of the normal diodes in another embodiment. In some embodiments, the ESD arrays 203, 305, 500 shown in FIGS. 2, 3A, 5, respectively may be implemented as an array of ESD power clamp circuits 600c patterned in the carrier wafer. In some embodiments, the first node and the second node illustrated in FIGS. 6A-6C may be exchanged when being implemented in any of the ESD arrays 203, 305, 500 shown in FIGS. 2, 3A, 5, respectively. In some embodiments, different ESD power clamp circuits 501 in FIG. 5 may be implemented as different ESD power clamp circuits 600a, 600b, 600c illustrated in FIGS. 6A-6C, respectively.

Figure 7:
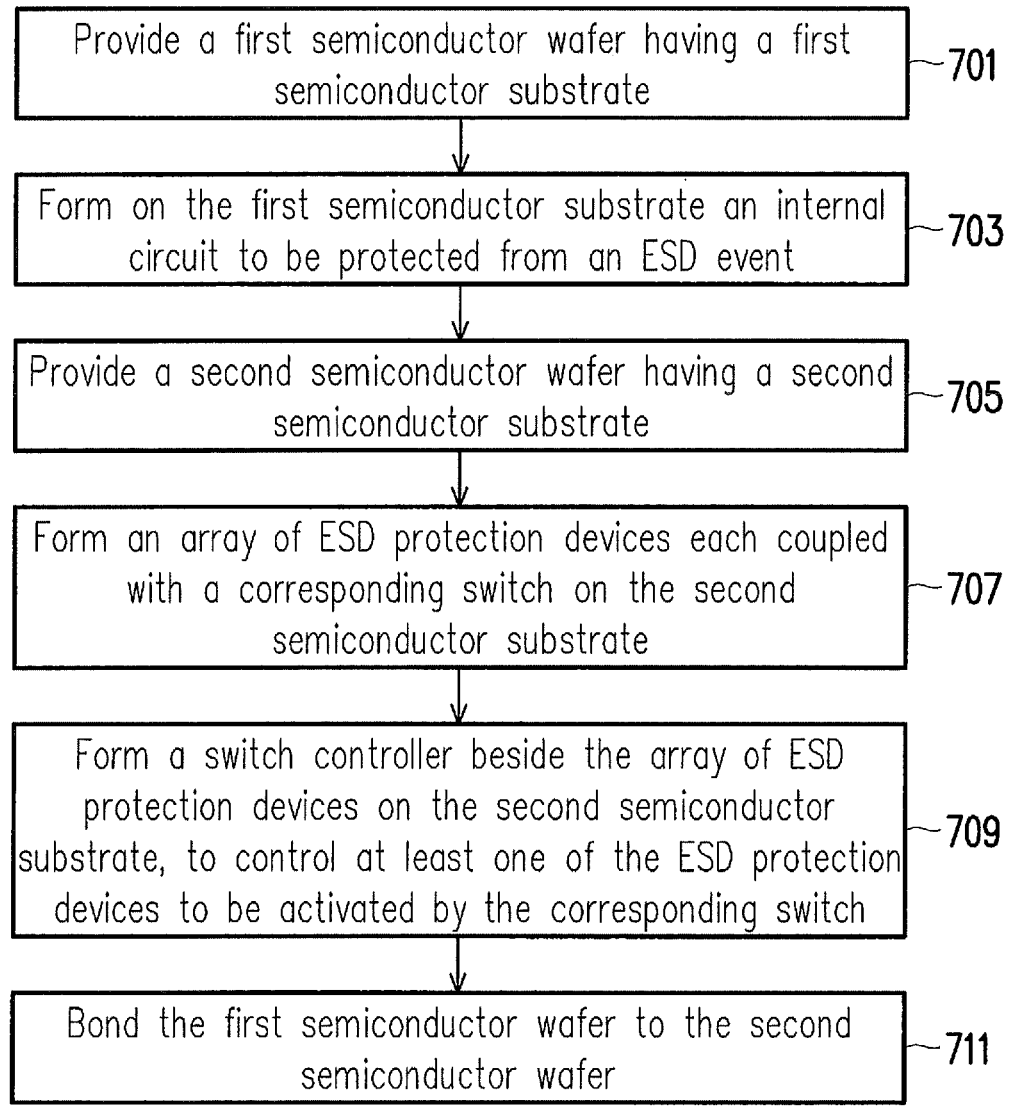
FIG. 7 illustrates a flow chart of a method for forming an electrostatic discharge (ESD) protection device, in accordance with some embodiments of the present disclosure.

FIG. 7 illustrates a flow chart of a method 700 for forming an electrostatic discharge (ESD) protection device, in accordance with some embodiments. Although the exemplary method shown in FIG. 7 is described in relation to FIGS. 1-6, it will be appreciated that this exemplary method is not limited to such structures disclosed in FIGS. 1-6 and may stand alone independent of the structures disclosed in FIGS. 1-6. In addition, some operations of the exemplary method illustrated in FIG. 7 may occur in different orders and/or concurrently with other operations or events apart from those illustrated and/or described herein. Moreover, not all illustrated operations may be required to implement one or more aspects or embodiments of the present disclosure. Further, one or more of the operations depicted herein may be carried out in one or more separate operations and/or phases.

At operation 701, a first semiconductor wafer having a first semiconductor substrate is provided. In some embodiments, the first semiconductor wafer may include transistor devices to be protected from an ESD event. In various embodiments, the transistor devices may form an integrated circuit or a microdevice.

At operation 703, an internal circuit to be protected from an ESD event may be formed on the first semiconductor substrate. In some embodiments, the first semiconductor substrate of the first semiconductor wafer may be formed on top of a power delivery network (PDN) layer that is configured to deliver power to the internal circuit formed in the first semiconductor substrate. Furthermore, according to some embodiments, interconnections for the internal circuit formed in the first semiconductor substrate may be patterned on a back-end-of-line (BEOL) layer formed on a top surface of the first semiconductor substrate.

At operation 705, a second semiconductor wafer having second semiconductor substrate may be provided. In further embodiments, the first and second semiconductor wafers may be fabricated using different semiconductor manufacturing processes.

At operation 707, an array of ESD protection devices each coupled with a corresponding switch may be formed on the second semiconductor substrate. In some embodiments, the array of the ESD protection devices may include an ESD power clamp circuit coupled with a switch for turning on or off the ESD power clamp circuit. The array of the ESD protection devices is configured to channel away from the internal circuit in the first semiconductor substrate the high current generated in response to an ESD event.

In further exemplary embodiments, the forming of the array of the ESD protection devices at operation 707 may further include forming a plurality of semiconductor wells in the second semiconductor substrate of the second semiconductor wafer and forming first and second doped regions having dopants of opposite type in the plurality of semiconductor wells. In some embodiments, the first and second doped regions are electrically connected between a high power supply rail and a low power supply rail.

At operation 709, a switch controller is formed beside the array of ESD protection devices on the second semiconductor substrate, to control one or more of the ESD protection devices to be activated by the corresponding switch. In some embodiments, forming the internal circuit at operation 703 further comprises forming an ESD array controlling circuit in the internal circuit. The ESD array controlling circuit is programmable to determine a number of ESD protection devices to be activated in the array of ESD protection devices, and is configured to generate a control signal to indicate the number. Accordingly, the switch controller formed at operation 709 is configured to control the corresponding switches to activate, based on the control signal, the number of ESD protection devices to protect the internal circuit from the ESD event.

At operation 711, the first semiconductor wafer is bonded to the second semiconductor wafer. In some embodiments, the first semiconductor wafer may be a device wafer and the second semiconductor wafer may be a carrier wafer. Moreover, during the bonding operation 711, the front surfaces of the carrier wafer and device wafer may be placed in contact with one another and bonded via thermal compression bonding. In some exemplary wafer stack formation process, the carrier wafer may be bonded to a High Density Plasma (HDP) oxide layer of the device wafer during the wafer bonding operation 711.

In one embodiment, a disclosed apparatus includes: an internal circuit formed in a first wafer; an array of electrostatic discharge (ESD) circuits formed in a carrier wafer, wherein the ESD circuits include a plurality of ESD protection devices each coupled to a corresponding switch and configured to protect the internal circuit from a transient ESD event; and a switch controller in the carrier wafer, wherein the switch controller is configured to control, based on a control signal from the first wafer, each of the plurality of ESD protection devices to be activated or deactivated by the corresponding switch, and wherein the first wafer is bonded to the carrier wafer.

In another embodiment, an apparatus including an electrostatic discharge (ESD) protection device is disclosed. The apparatus includes: a first wafer having integrated circuits formed therein; and a carrier wafer bonded to the first wafer. The carrier wafer comprises: a plurality of ESD protection devices each coupled with a corresponding switch, and a switch controller configured to control, based on a control signal from the first wafer, a number of ESD protection devices to be activated by the corresponding switch among the plurality of ESD protection devices, wherein the activated ESD protection devices are configured to clamp an ESD voltage during an ESD event so as to protect the integrated circuits from the ESD event.

In yet another embodiment, a method of forming an electrostatic discharge (ESD) protection device is disclosed. The method includes: providing a first semiconductor wafer having a first semiconductor substrate; forming on the first semiconductor substrate an internal circuit to be protected from an ESD event; providing a second semiconductor wafer having a second semiconductor substrate; forming an array of ESD protection devices each coupled with a corresponding switch on the second semiconductor substrate; forming a switch controller beside the array of ESD protection devices on the second semiconductor substrate, wherein the switch controller is configured to control at least one of the ESD protection devices to be activated by the corresponding switch to protect the internal circuit from the ESD event; and bonding the first semiconductor wafer to the second semiconductor wafer.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A method of forming an electrostatic discharge (ESD) protection device, comprising:
   providing a first semiconductor wafer having a first semiconductor substrate;

forming on the first semiconductor substrate an internal circuit to be protected from an ESD event;
providing a second semiconductor wafer having a second semiconductor substrate;
forming an array of ESD protection devices each coupled with a corresponding switch on the second semiconductor substrate;
forming a switch controller beside the array of ESD protection devices on the second semiconductor substrate, wherein the switch controller is configured to control at least one of the ESD protection devices to be activated by the corresponding switch to protect the internal circuit from the ESD event; and
bonding the first semiconductor wafer to the second semiconductor wafer.

2. The method of claim 1, wherein forming the internal circuit further comprises:
forming an ESD array controlling circuit in the internal circuit, wherein the ESD array controlling circuit is programmable to determine a number of ESD protection devices to be activated in the array of ESD protection devices, and is configured to generate a control signal to indicate the number.

3. The method of claim 2, wherein:
the switch controller is configured to control the switches to activate, based on the control signal, the number of ESD protection devices to protect the internal circuit from the ESD event.

4. The method of claim 2, wherein:
the control signal is one of: a digital signal or a radio frequency signal; and
the ESD array controlling circuit determines the quantity of ESD protection devices to be activated based on a program with input information related to customer requirement.

5. The method of claim 1, wherein forming the array of the ESD protection devices further comprises:
forming a plurality of semiconductor wells in the second semiconductor substrate of the second semiconductor wafer;
forming first and second doped regions having dopants of opposite type in the plurality of semiconductor wells;
wherein the first and second doped regions are electrically connected between a high power supply rail and a low power supply rail.

6. The method of claim 1, wherein:
the first semiconductor substrate is formed on a top surface of a power delivery network (PDN) layer configured to deliver power to the internal circuit formed in the first semiconductor substrate;
interconnections for the internal circuit formed in the first semiconductor substrate are formed on a back-end-of-line (BEOL) layer formed on a top surface of the first semiconductor substrate.

7. A method of forming an electrostatic discharge (ESD) protection device, comprising:
forming a circuit in a first wafer;
forming an array of electrostatic discharge (ESD) circuits in a second wafer, wherein the ESD circuits include a plurality of ESD protection devices each coupled to a corresponding switch and configured to protect the circuit from a transient ESD event; and
forming a switch controller in the second wafer, wherein the switch controller is configured to control, based on a control signal from the first wafer, each of the plurality of ESD protection devices to be activated or deactivated by the corresponding switch, and wherein the first wafer is bonded to the second wafer.

8. The method of claim 7, wherein:
the circuit comprises an ESD array controlling circuit; and
the array of ESD controlling circuits determines a quantity of ESD protection devices to be activated among the plurality of ESD protection devices, and is configured to generate the control signal based on the quantity.

9. The method of claim 7, further comprising electrically coupling each of the plurality of ESD protection devices between a first node and a second node when being activated by the corresponding switch.

10. The method of claim 9, further comprising:
connecting the first node to a power supply rail; and
connecting the second node to an ESD bus line.

11. The method of claim 10, wherein the plurality of ESD protection devices comprise an array of diodes electrically coupled in parallel between the power supply rail and the ESD bus line.

12. The method of claim 10, wherein the plurality of ESD protection devices comprise an array of ESD power clamp circuits electrically coupled in parallel between the power supply rail and the ESD bus line.

13. The method of claim 12, wherein at least one of the ESD power clamp circuits further comprises:
an ESD detection circuit comprising of a resistor in series with a capacitor and configured to detect the transient ESD event;
an inverter having an input connected to the ESD detection circuit; and
a field-effect transistor (FET) transistor having a gate connected to an output of the inverter.

14. The method of claim 10, wherein:
the power supply rail is a high power supply rail or a low power supply rail; and
the ESD protection devices are configured to provide a pathway for an ESD current to flow to the power supply rail when the power supply rail is a low power supply rail, or flow to the ESD bus line when the power supply rail is a high power supply rail.

15. The method of claim 10, wherein the ESD bus line is electrically coupled to an input/output (I/O) bump pad.

16. A method of forming an electrostatic discharge (ESD) protection device, comprising:
forming an integrated circuit in a first wafer; and
bonding a second wafer to the first wafer, wherein the second wafer comprises:
a plurality of ESD protection devices each coupled with a corresponding switch, and
a switch controller configured to control, based on a control signal from the first wafer, a number of ESD protection devices to be activated by the corresponding switch among the plurality of ESD protection devices, wherein the activated ESD protection devices are configured to clamp an ESD voltage during an ESD event so as to protect the integrated circuits from the ESD event.

17. The method of claim 16, wherein:
the plurality of ESD protection devices are formed in semiconductor wells positioned in a silicon substrate of the second wafer; and
the first wafer further comprises a back-end-of-line (BEOL) metallization layer configured to interconnect the integrated circuits.

18. The method of claim 16, wherein:
the integrated circuits comprise an ESD array controlling circuit; and
the ESD array controlling circuit is programmable to determine the number of ESD protection devices to be activated among the plurality of ESD protection devices, and is configured to generate the control signal to indicate the number.

19. The method of claim 16, wherein the second wafer further comprises:
a plurality of power supply rails electrically coupled to each other; and
a plurality of ESD bus lines electrically coupled to each other, wherein the ESD bus lines are electrically coupled to an input/output (I/O) bump pad.

20. The method of claim 19, wherein:
each of the plurality of ESD protection devices has two terminals;
a first terminal of the two terminals is electrically coupled to one of the power supply rails; and
a second terminal of the two terminals is electrically coupled to one of the ESD bus lines via the corresponding switch.

\* \* \* \* \*